US007880928B2

(12) United States Patent
Mongeon

(10) Patent No.: US 7,880,928 B2
(45) Date of Patent: *Feb. 1, 2011

(54) COLOR IMAGE PROCESS CONTROLS METHODS AND SYSTEMS

(75) Inventor: Michael C. Mongeon, Walworth, NY (US)

(73) Assignee: Xerox Corporation, Norwalk, CT (US)

( * ) Notice: Subject to any disclaimer, the term of this patent is extended or adjusted under 35 U.S.C. 154(b) by 363 days.

This patent is subject to a terminal disclaimer.

(21) Appl. No.: 11/962,568

(22) Filed: Dec. 21, 2007

(65) Prior Publication Data

US 2009/0161128 A1 Jun. 25, 2009

(51) Int. Cl.
*G03F 3/08* (2006.01)
*G06F 15/00* (2006.01)

(52) U.S. Cl. ........................ 358/1.9; 358/504; 358/515; 358/518; 358/520

(58) Field of Classification Search .................. 358/1.1, 358/1.9, 2.1, 504, 515, 518, 520
See application file for complete search history.

(56) References Cited

U.S. PATENT DOCUMENTS 4,710,785 A 12/1987 Mills
5,510,896 A 4/1996 Wafler
5,884,118 A 3/1999 Mestha
6,418,281 B1 7/2002 Ohki
6,922,197 B2 * 7/2005 Saito .......................... 358/1.9
7,123,391 B2 * 10/2006 Saito .......................... 358/518
7,456,998 B2 * 11/2008 Nishikawa .................. 358/1.9
7,460,283 B2 * 12/2008 Saito .......................... 358/515
2003/0164960 A1 * 9/2003 Housel ....................... 358/1.9
2004/0100640 A1 * 5/2004 Saito .......................... 358/1.1
2004/0183814 A1 * 9/2004 Saito .......................... 345/601
2005/0018225 A1 * 1/2005 Nishikawa .................. 358/1.9
2006/0061782 A1 3/2006 Yao
2006/0061783 A1 3/2006 Yao
2006/0077488 A1 4/2006 Zhang et al.
2006/0077489 A1 4/2006 Zhang et al.
2006/0110031 A1 5/2006 Bala et al.
2006/0152764 A1 7/2006 Loce et al.
2006/0153581 A1 7/2006 Mo et al.
2006/0153582 A1 7/2006 Mo et al.
2006/0209101 A1 9/2006 Mizes
2006/0222257 A1 10/2006 Mestha et al.
2006/0227391 A1 10/2006 Updegraff
2006/0244980 A1 11/2006 Grace
2006/0245773 A1 11/2006 Gross et al.
2006/0251437 A1 11/2006 Donaldson
2006/0279753 A1 12/2006 Yao et al.
2007/0070455 A1 * 3/2007 Mongeon .................... 358/504
2007/0097461 A1 * 5/2007 Ng et al. ..................... 358/504
2007/0139734 A1 6/2007 Fan et al.
2007/0140552 A1 6/2007 Fan et al.
2007/0177231 A1 8/2007 Wang et al.
2007/0253009 A1 11/2007 Horn et al.
2007/0263238 A1 * 11/2007 Lieberman et al. ........... 358/1.9
2008/0144141 A1 * 6/2008 Tai et al. ..................... 358/518
2009/0296111 A1 * 12/2009 Mongeon .................... 358/1.9

* cited by examiner

*Primary Examiner*—Kimberly A Williams
(74) *Attorney, Agent, or Firm*—Fay Sharpe LLP

(57) ABSTRACT

This disclosure provides color image process methods and systems to control hue variation associated with a color printing system. In particular, it provides a method and system to adjust a control patch associated with a color separation to force a chromatic difference and control perceived color accuracy.

20 Claims, 6 Drawing Sheets

COLOR IMAGE PROCESS CONTROLS METHODS AND SYSTEMS

BACKGROUND

This disclosure relates to color printing systems. It finds particular application in conjunction with adjusting image quality in color print and color marking systems. However, it is to be appreciated that the disclosed exemplary embodiments are also amenable to other like applications.

Typically, in image rendering systems, such as a color printing system, it is desirable to have a rendered image closely match a desired input image. However, many factors, such as temperature, humidity, ink or toner age, and/or component wear, tend to move the output of the printing system away from the ideal target output. For example, xerographic marking engines system component tolerances and drifts, as well as environmental disturbances, may tend to move an engine response curve (ERC) away from the ideal target engine response. This shift of the engine response may result in printed images which are lighter or darker than desired by the user.

In addition to the variation of the overall engine response, as discussed above, variations in the color separations of a color printing system may contribute to hue shifts associated with a printed output. These variations may occur over time and result in a reduction in perceived color accuracy of a printed output.

INCORPORATION BY REFERENCE

The following patent and applications, the disclosures of each being totally incorporated herein by reference are mentioned:

U.S. Pat. No. 4,710,785, which issued Dec. 1, 1987 to Mills, entitled PROCESS CONTROL FOR ELECTROSTATIC MACHINE, discusses an electrostatic machine having at least one adjustable process control parameter.

U.S. Pat. No. 5,510,896, which issued Apr. 23, 1996 to Wafler, entitled AUTOMATIC COPY QUALITY CORRECTION AND CALIBRATION, discloses a digital copier that includes an automatic copy quality correction and calibration method that corrects a first component of the copier using a known test original before attempting to correct other components that may be affected by the first component.

U.S. Pat. No. 5,884,118, which issued Mar. 16, 1999 to Mestha, entitled PRINTER HAVING PRINT OUTPUT LINKED TO SCANNER INPUT FOR AUTOMATIC IMAGE ADJUSTMENT, discloses an imaging machine having operating components including an input scanner for providing images on copy sheets and a copy sheet path connected to the input scanner.

U.S. Pat. No. 6,418,281, which issued Jul. 9, 2002 to Ohki, entitled IMAGE PROCESSING APPARATUS HAVING CALIBRATION FOR IMAGE EXPOSURE OUTPUT, discusses a method wherein a first calibration operation is performed in which a predetermined grayscale pattern is formed on a recording paper and this pattern is read by a reading device to produce a LUT for controlling the laser output in accordance with the image signal (gamma correction).

BRIEF DESCRIPTION

In one aspect of this disclosure, a method of controlling hue variation associated with a color IME (Image Marking Engine) is disclosed. The method comprises printing a control patch for each color separation associated with the IME, the control patches associated with the actual rendering of respective target colors; measuring the color separation error associated with the control patches relative to respective target colors; determining which color separation has the maximum color separation error, and which color separation has the minimum color separation error; and reducing the density of the target color associated with the color separation associated with the maximum color separation error, and increasing the density of the target color associated with the color separation associated with the minimum color separation error, wherein the adjustment of the target colors associated with the maximum color separation error and minimum color separation error reduces the IME rendered hue variation associated with the IME color separations.

In another aspect of this disclosure, an image rendering system is disclosed. The image rendering system comprises one or more color IMEs, and a controller, the controller configured to execute the method comprising printing a control patch for each color separation associated with the IME, the control patches associated with the actual rendering of respective target colors; measuring the color separation error associated with the control patches relative to respective target colors; determining which color separation has the maximum color separation error, and which color separation has the minimum color separation error; and reducing the density of the target color associated with the color separation associated with the maximum color separation error, and increasing the density of the target color associated with the color separation associated with the minimum color separation error, wherein the adjustment of the target colors associated with the maximum color separation error and minimum color separation error reduces the IME rendered hue variation associated with the IME color separations.

In still another aspect of this disclosure, a xerographic printing system is disclosed. The xerographic printing system comprises one or more color IMEs, and a controller, the controller configured to execute the method comprising printing a control patch for each color separation associated with the IME, the control patches associated with the actual rendering of respective target colors; measuring the color separation error associated with the control patches relative to respective target colors; determining which color separation has the maximum color separation error, and which color separation has the minimum color separation error; and reducing the density of the target color associated with the color separation associated with the maximum color separation error, and increasing the density of the target color associated with the color separation associated with the minimum color separation error, wherein the adjustment of the target colors associated with the maximum color separation error and minimum color separation error reduces the IME rendered hue variation associated with the IME color separations.

DETAILED DESCRIPTION

Traditional color engines apply independent TRC control for each color separation. This disclosure provides a "separation dependent" method for CMY control that forces chromatic color differences and avoids hue shifts. By forcing chromatic color differences, the color variation is less perceptible, and therefore results in improved perceived color accuracy.

The method disclosed considers color variation between preceeding and current separation, and adapts a patch sensor target to minimize this difference. In simplest terms, the adaptive control forces the error for each separation to vary in the same sense (lighter/darker). Experimental results indicate a 2× improvement in color difference error ($\Delta E_{2000}$). This technique can be advantageous since it can be implemented on some existing control algorithms without the need to modify some existing control sensors. Furthermore, this control algorithm can be added to current products to improve performance.

The following assumptions help to illustrate the basis of the control system disclosed:

Assume independent CMYK tone reproduction control using patch sensor(s)

Assume TRC variation is lighter/darker with maximum variation in midtones

Assume linear TRC response, measured in "delta E from paper" units, with halftone cell area coverage $$\Delta Ep(AC)=\Delta Ep\_\text{solid}*AC, \text{ where} \quad (1)$$

ΔEp_solid=solid area ΔE from paper

AC=area coverage [0, 1]

Assume a patch sensor is used to measure reflectance for CMYK seps, in RR (relative reflectance) units Assume each separation is controlled within a tolerance band of +/−5% for each separation Example of Red Variation To illustrate a red variation, assume the Yellow and Magenta separations are controlled within a tolerance band of +/−5%:

Yellow with ΔEp_solid=95, the midtone varies by +/−4.7ΔEp; and

Magenta with ΔEp_solid=90, will vary by +/−4.5 ΔEp.

With independent control, the secondary mixture RED is allowed to vary in chroma or hue over the designed range, bounded by extremes shown in Table 1.

TABLE 1

Potential color shifts for RED at control boundaries

| Yellow | Magenta | Color Shift | Visual effect |
|---|---|---|---|
| strong | strong | Chroma | stronger red |
| strong | weak | Hue | orangish |
| weak | strong | Hue | magenta-ish |
| weak | weak | Chroma | weaker red |

Figure 1:
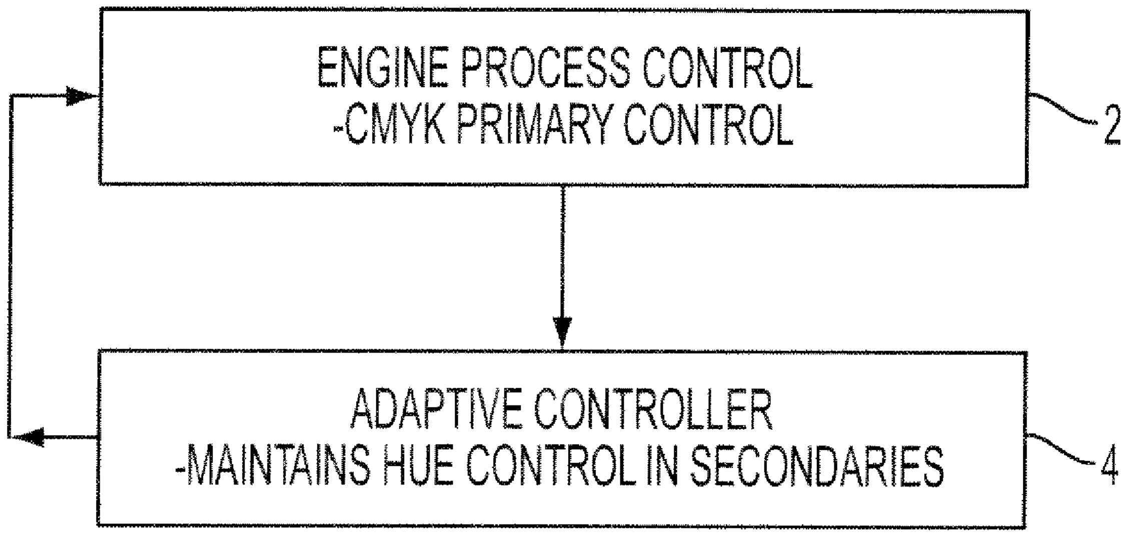
FIG. 1 illustrates an exemplary method of controlling hue associated with a color printing system according to this disclosure.

This disclosure provides an adaptive control approach to avoid the conditions in which hue variation occurs and the adaptive control can potentially work with an existing engine process control, as shown in FIG. 1.

Figure 2:
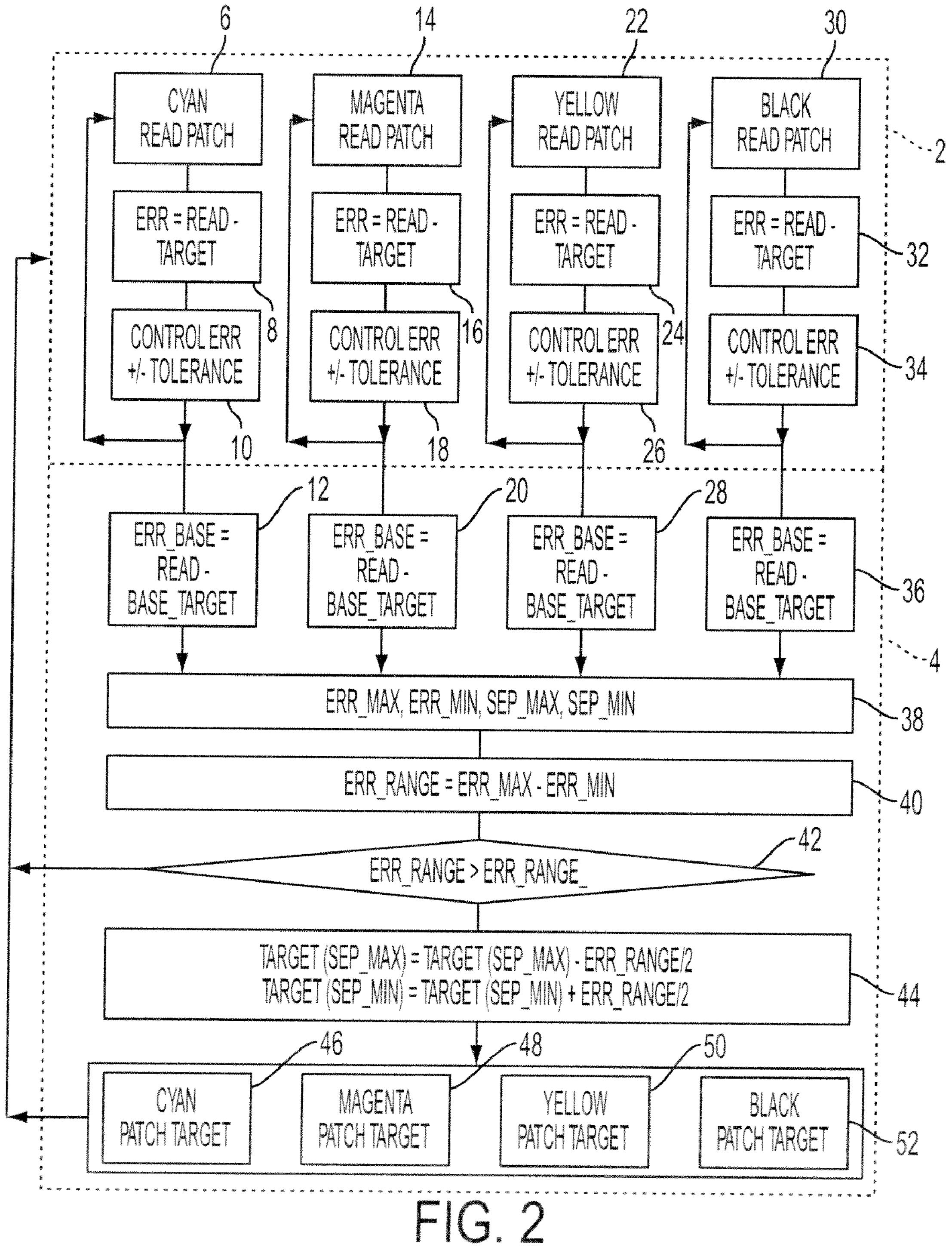
FIG. 2 illustrates an exemplary control algorithm to adjust M & Y patch targets to control red hue, and C & R targets (where R=M+Y) to control process black according to this disclosure.

With reference to FIG. 2, illustrated is an exemplary system for controlling hue variation associated with an IME according to this disclosure.

The system comprises an Engine Color Process Control 2 which is a primary control for generating device dependent color space values for the IME, for example CMYK. In addition, the system comprises an Adaptive Controller 4 to maintain hue control in secondary colors. In other words, the adaptive controller provides a means for minimizing hue variation as described in Table 1.

With reference to FIG. 2, illustrated is a flow chart representing an exemplary color management control system, according to this disclosure. The control algorithm adjusts M & Y Patch targets to control red hue variation, and C & R targets (where R=M+Y) to control process black according to this disclosure.

The adaptive control strategy allows the system to vary within its control band, but the primary separation targets are adjusted to force a chroma shift by also controlling secondary (separation to separation) errors.

Under normal operation, a color engine is controlled within its design tolerances by independent control of separations, shown bounded by a dashed rectangle 2 in FIG. 2.

Initially, a cyan, magenta, yellow and black patch is measured/read by a sensor, indicated as reference characters 6, 14, 22 and 30, respectively.

Next, the IME Process Control 2 generates an error for each CMYK color, 8, 6, 24 and 32 respectively, by comparing the read patch with respective target patch data.

Next, the IME process control 2 maintains the tolerance of the IME to provide CMYK patches which are within the +/−tolerance error of the IME.

The adaptive controller utilizes output from the independent controllers, and adjusts the patch sensor targets as follows:

1.) Calculate 38 ERR for each separation relative to the "base" target. Si_err=Si_read−Si_base_target, where i is the separation number.

2.) Determine 38 which separation has the maximum and minimum error:

ERR_Max=Max(Si_err);

ERR_Min=Min(Si_err);

Sep_Max=index(Max(Si_err)); and

Sep_Min=index(Min(Si_err)).

3.) Compute 40 the ERR_range:

ERR_range=ERR_Max−ERR_Min.

4.) If ERR_range exceeds ERR_range_target, then adjust 44 the patch_targets (i.e. cyan patch target 46, magenta patch 48, yellow patch target 50 and black patch target 52) for Sep_Max and Sep_Min as follows:

Target (Sep_Max)=Target (Sep_Max)−ERR_range/2; and

Target (Sep_Min)=Target (Sep_Min)+ERR_range/2.

Figure 3:
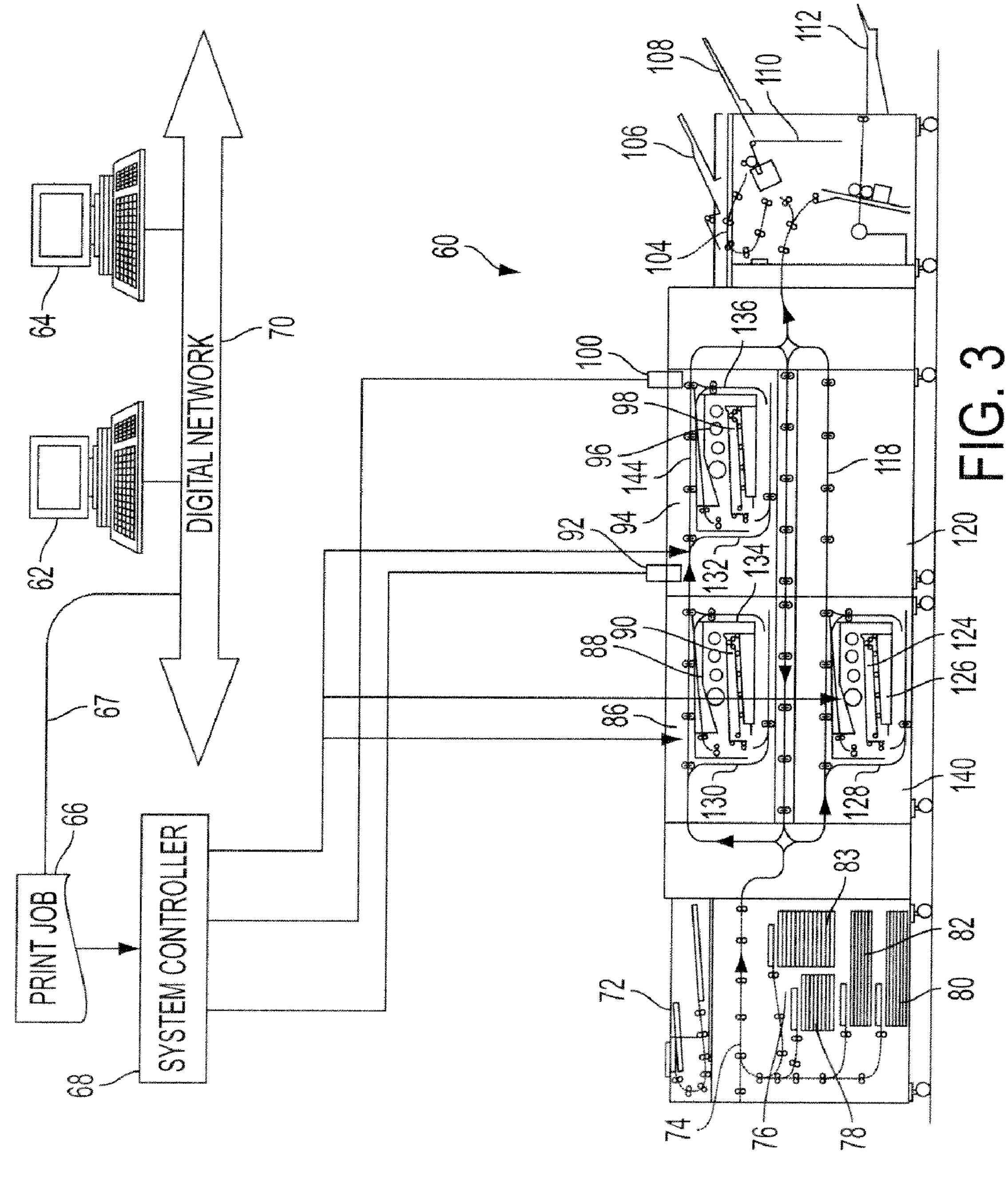
FIG. 3 illustrates an exemplary color printing system according to this disclosure.

With reference to FIG. 3, illustrated is an exemplary printing or document processing system according to this disclosure. The system includes first, second, . . . , nth marking engine processing units 86, 94, 140, . . . , each including an associated first, second, . . . , nth marking or print engines or devices 88, 96, 126 and associated entry and exit inverter/bypasses 130, 132, and 128, respectively. Notably, the embodiment may include marking engines which are removable. For example, in FIG. 3, an integrated marking engine and entry and exit inverter/bypasses of the processing unit

120 are shown as removed, leaving only a forward or upper paper path 144. In this manner, for example, the functional marking engine portion can be removed for repair, or can be replaced to effectuate an upgrade or modification of the printing system 60.

While three marking engines 88, 96, 126 are illustrated (with the fourth marking engine being removed), the number of marking engines can be one, two, three, four, five, or more. Providing at least two marking engines typically provides enhanced features and capabilities for the printing system 60 since marking tasks can be distributed amongst the at least two marking engines. Some or all of the marking engines 88, 96, 126 may be identical to provide redundancy or improved productivity through parallel printing. Alternatively or additionally, some or all of the marking engines may be different to provide different capabilities. For example, the marking engines 96, 126 may be color marking engines, while the marking engine 88 may be a black (K) marking engine.

As discussed in detail below, a system controller 68 includes a relative reflectance determining device (i.e. sensors 92, and 100) or processor or algorithm. The system controller 68 determines the associated relative reflectance of control patches associated with each color separation. The system controller 68 analyzes the measured relative reflectance against one or more predetermined parameters target colors. Based on the analysis, an image quality control algorithm or processor or device determines what adjustment is needed, i.e., a target color is adjusted or modified by means of an actuator (i.e. 90, 98 and 124).

With continuing reference to FIG. 3, the illustrated marking engines 88, 96, 126 employ xerographic printing technology, in which an electrostatic image is formed and coated with a toner material, and then transferred and fused to paper or another print medium by application of heat and pressure. However, marking engines employing other printing technologies can be provided, such as marking engines employing ink jet transfer, thermal impact printing, or so forth. The processing units of the printing system 60 can also be other than marking engines; such as, for example, a print media feeding source or feeder 76 which includes associated print media conveying components 74. The media feeding source 76 supplies paper or other print media for printing. Another example of a processing unit is a finisher 110 which includes associated print media conveying components 104. The finisher 110 provides finishing capabilities such as collation, stapling, folding, stacking, hole-punching, binding, postage stamping, and so forth.

The print media feeding source 76 includes print media sources or input trays 78, 80, 82, 83 connected with the print media conveying components 74 to provide selected types of print media. While four print media sources are illustrated, the number of print media sources can be one, two, three, four, five, or more. Moreover, while the illustrated print media sources 78, 80, 82, 83 are embodied as components of the dedicated print media feeding source 76, in other embodiments one or more of the marking engine processing units may include its own dedicated print media source instead of or in addition to those of the print media feeding source 76. Each of the print media sources 78, 80, 82, 83 can store sheets of the same type of print media, or can store different types of print media. For example, the print media sources 80, 82 may store the same type of large-size paper sheets, print media source 78 may store company letterhead paper, and the print media source 83 may store letter-size paper. The print media can be substantially any type of media upon which one or more of the marking engines 88, 96, 126 can print, such as high quality bond paper, lower quality "copy" paper, overhead transparency sheets, high gloss paper, and so forth.

Since multiple jobs can arrive at the finisher 110 during a common time interval, the finisher 110 includes two or more print media finishing destinations or stackers 106, 108, 112 for collecting sequential pages of each print job that is being contemporaneously printed by the printing system 60. Generally, the number of the print jobs that the printing system 60 can contemporaneously process is limited to the number of available stackers. While three finishing destinations are illustrated, the printing system 60 may include two, three, four, or more print media finishing destinations. The finisher 110 deposits each sheet after processing in one of the print media finishing destinations 106, 108, 112, which may be trays, pans, stackers and so forth. While only one finishing processing unit is illustrated, it is contemplated that two, three, four or more finishing processing units can be employed in the printing system 60.

Bypass routes in each marking engine processing unit provide a means by which the sheets can pass through the corresponding marking engine processing unit without interacting with the marking engine. Branch paths are also provided to take the sheet into the associated marking engine and to deliver the sheet back to the upper or forward paper path 144 of the associated marking engine processing unit.

The printing system 60 executes print jobs. Print job execution involves printing selected text, line graphics, images, machine ink character recognition (MICR) notation, or so forth on front, back, or front and back sides or pages of one or more sheets of paper or other print media. In general, some sheets may be left completely blank. In general, some sheets may have mixed color and black-and-white printing. Execution of the print job may also involve collating the sheets in a certain order. Still further, the print job may include folding, stapling, punching holes into, or otherwise physically manipulating or binding the sheets.

Print jobs can be supplied to the printing system 60 in various ways. A built-in optical scanner 72 can be used to scan a document such as book pages, a stack of printed pages, or so forth, to create a digital image of the scanned document that is reproduced by printing operations performed by the printing system 60. Alternatively, one or more print jobs 66 can be electronically delivered to a system controller 68 of the printing system 60 via a wired connection 67 from a digital network 70 that interconnects computers 62, 64 or other digital devices. For example, a network user operating word processing software running on the computer 64 may select to print the word processing document on the printing system 60, thus generating the print job 66, or an external scanner (not shown) connected to the network 70 may provide the print job in electronic form. While a wired network connection 67 is illustrated, a wireless network connection or other wireless communication pathway may be used instead or additionally to connect the printing system 60 with the digital network 70. The digital network 70 can be a local area network such as a wired Ethernet, a wireless local area network (WLAN), the Internet, some combination thereof, or so forth. Moreover, it is contemplated to deliver print jobs to the printing system 60 in other ways, such as by using an optical disk reader (not illustrated) built into the printing system 60, or using a dedicated computer connected only to the printing system 60.

The printing system 60 is merely an illustrative example. In general, any number of print media sources, media handlers, marking engines, collators, finishers or other processing units can be connected together by a suitable print media conveyor configuration. While the printing system 60 illustrates a 2×2 configuration of four marking engines, buttressed by the print media feeding source on one end and by the finisher on the other end, other physical layouts can be used, such as an entirely horizontal arrangement, stacking of processing units three or more units high, or so forth. Moreover, while in the printing system 60 the processing units have removable functional portions, in some other embodiments some or all processing units may have non-removable functional portions. It is contemplated that even if the marking engine portion of the marking engine processing unit is non-removable, associated upper or forward paper paths 144 and 118 through each marking engine processing unit enables the marking engines to be taken "off-line" for repair or modification while the remaining processing units of the printing system continue to function as usual.

In some embodiments, separate bypasses for intermediate components may be omitted. The "bypass path" of the conveyor in such configurations suitably passes through the functional portion of a processing unit, and optional bypassing of the processing unit is effectuated by conveying the sheet through the functional portion without performing any processing operations. Still further, in some embodiments the printing system may be a stand alone printer or a cluster of networked or otherwise logically interconnected printers, with each printer having its own associated print media source and finishing components including a plurality of final media destinations.

Although several media path elements are illustrated, other path elements are contemplated which might include, for example, inverters, reverters, interposers, and the like, as known in the art to direct the print media between the feeders, printing or marking engines and/or finishers.

The system controller 68 controls the production of printed sheets, the transportation over the media path, and the collation and assembly as job output by the finisher.

EXPERIMENTAL RESULTS

TRC (Tone Reproduction Curve) variation was applied to yellow and magenta in the following combinations using TRC simulation techniques:

| | |
|---|---|
| NOM | nominal yellow + nominal magenta |
| LL | light yellow + light magenta |
| HH | dark yellow + dark magenta |
| LH | light yellow + dark magenta |
| HL | dark yellow + light magenta |

Figure 4:
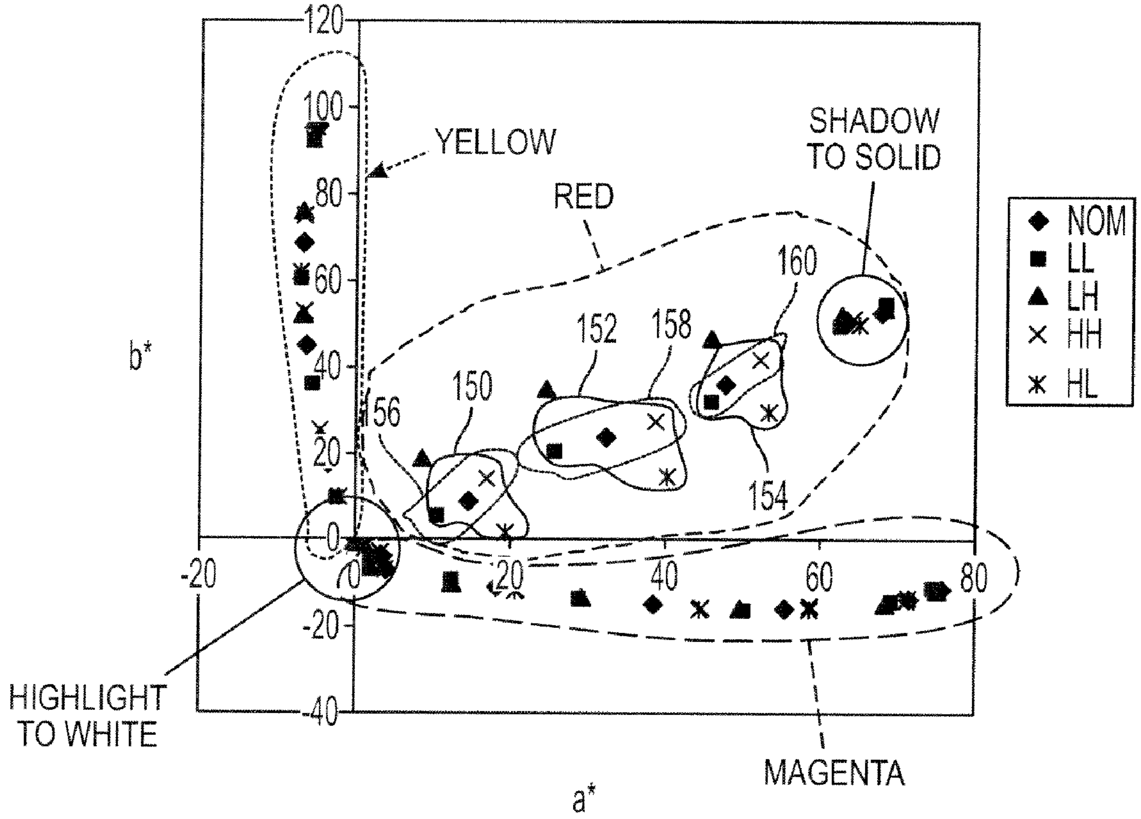
FIG. 4 illustrates the gamut projection plot of simulated TRCs before and after hue variation is reduced according to this disclosure.

With reference to FIG. 4, illustrated is the gamut projection covering the yellow-red-magenta region. The single separations, i.e. yellow and magenta, maintain a consistent hue as the chroma varies. However, as illustrated, the reds vary widely as the chroma changes. In other words, the hue shifts depending on the combination of Y and M. If errors are the "same sense," as in the LL and HH case, then a chroma shift occurs. If errors are in an "opposite sense," as in the LH and HL case, a hue shift occurs.

Notably, the midtone red colors, represented within boundaries 150, 152 and 154 provide the greatest hue shift in the LH and HL case, as compared with the highlight and shadow chromas.

Boundaries 156, 158 and 160 outline the hue variation associated with the mid-tone reds for simulated TRCs, after applying the hue variation control algorithms described in this disclosure.

Figure 5:
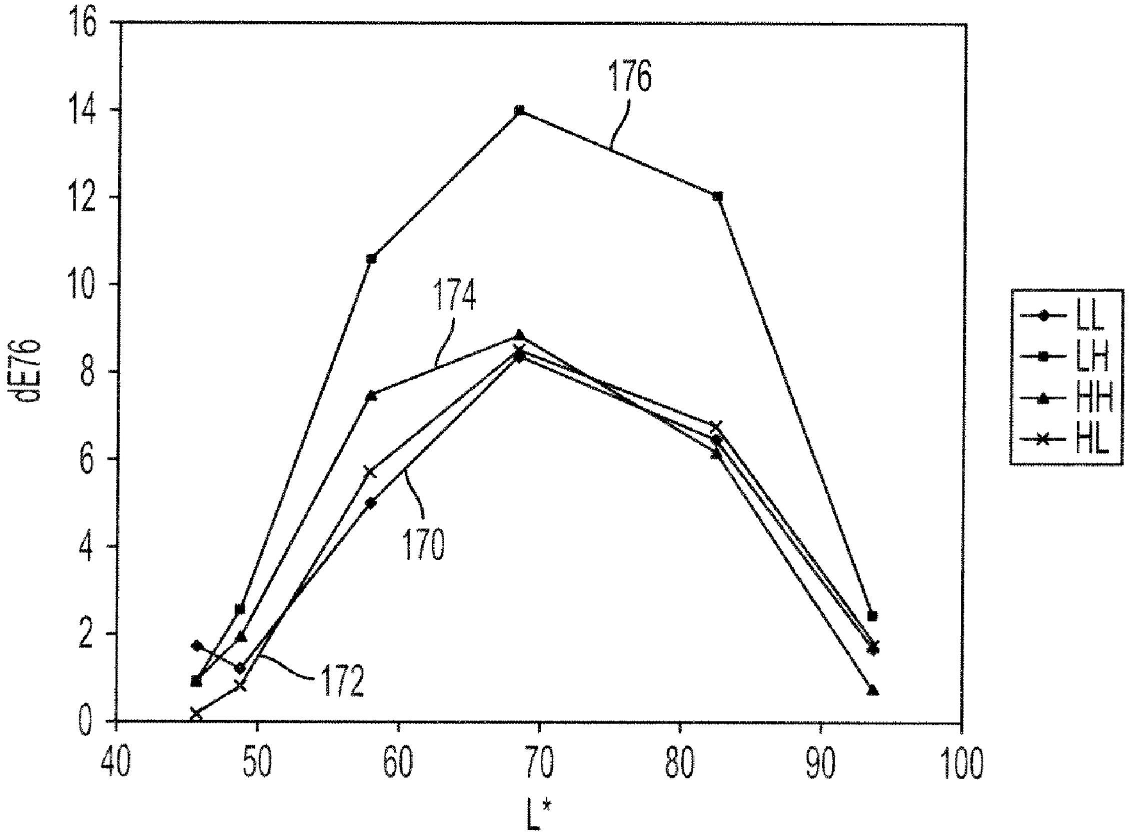
FIG. 5 illustrates the $\Delta E_{76}$ color difference measurements relative to nominal, associated with LL, LH, HH and HL.

With reference to FIG. 5, illustrated are the AE76 color differences, relative to nominal. Plot 176 illustrates LH, plot

174 illustrates HH, plot 172 illustrates HL and plot 170 illustrates LL. Notably, the plot indicates a larger error for LH, as compared to the others.

Figure 6:
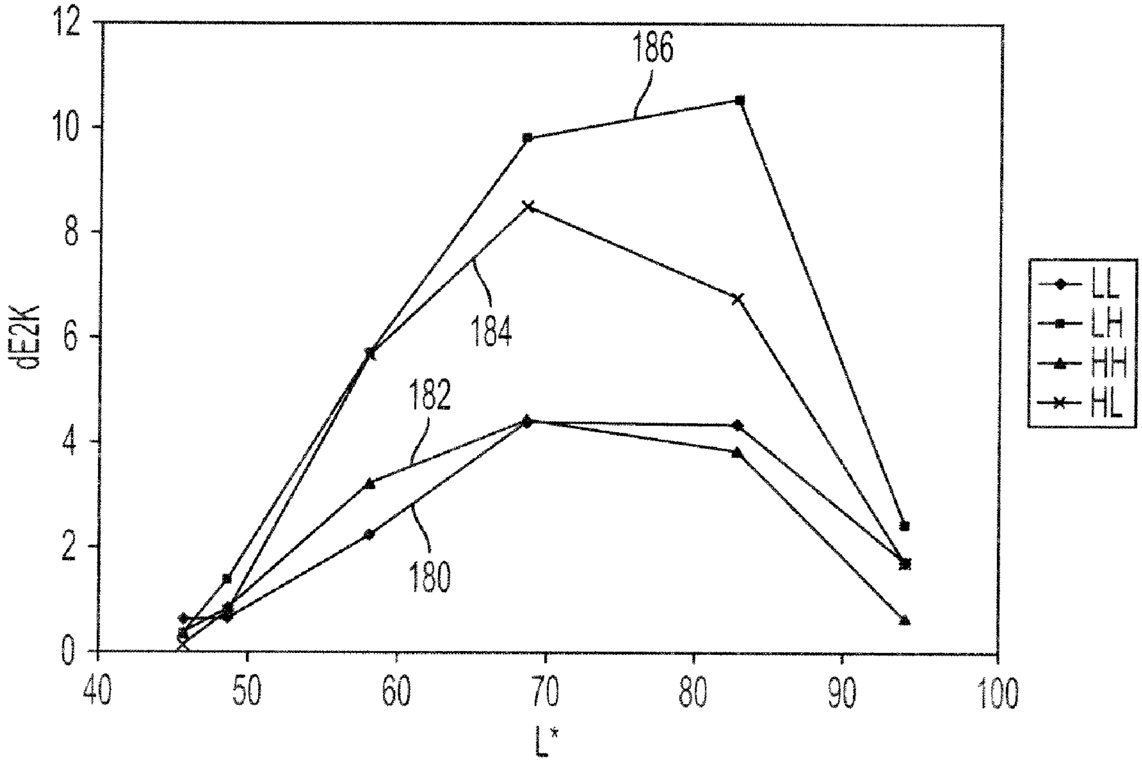
FIG. 6 illustrates the $\Delta E_{2000}$ color differences measurements associated with LL, LH, HH and HL.

With reference to FIG. 6, illustrated are the ΔE2000 red color differences achieved when applying a color perceptibility metric. Plot 186 illustrates LH, plot 184 illustrates HL, plot 182 illustrates HH and plot 180 illustrates LL. Notably, the ΔE2000 color difference for the LL and HH case is reduced by approximately 2×.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of controlling hue variation associated with a color IME (Image Marking Engine) comprising:

printing a control patch for each color separation associated with the IME, the control patches associated with the actual rendering of respective target colors;

measuring the color separation error associated with the control patches relative to respective target colors;

determining which color separation has the maximum color separation error, and which color separation has the minimum color separation error;

determining the color separation error range ERR_range=ERR Max−ERRMin, where ERR_Max equals the maximum color separation error and ERRMin equals the minimum color separation error; and reducing the density of the target color associated with the color separation associated with the maximum color separation error by a fraction of the ERR_range, and increasing the density of the target color associated with the color separation associated with the minimum color separation error by a fraction of the ERR_range, wherein the adjustment of the target colors associated with the maximum color separation error and minimum color separation error reduces the IME rendered hue variation associated with the IME color separations.

2. The method of controlling hue variation according to claim 1, comprising:

determining the color separation error range ERR_range=ERR_Max−ERRMin, where ERR_Max equals the maximum color separation error and ERRMin equals the minimum color separation error; and reducing the density of the target color associated with the color separation associated with the maximum color separation by ERR_range/2, and increasing the density of the target color associated with the color separation associated with the minimum color separation error by ERR_range/2.

3. The method of controlling hue variation associated with a color IME according to claim 2, comprising:

comparing the color separation error range ERR_range with a predetermined threshold value ERR_threshold; and reducing and increasing the density of the target colors only if ERR_range is greater than ERR_threshold.

4. The method of controlling hue variation associated with a color IME according to claim 3, wherein the target colors and control patches are midtone colors.

5. The method of controlling hue variation associated with a color IME according to claim 1, wherein the target colors and control patches are midtone colors.

6. The method of controlling hue variation associated with a color IME according to claim 1, comprising:

measuring the color separation error with an in-line densnometer operatively connected to the IME.

7. The method of controlling hue variation associated with a color IME according to claim 1, wherein the IME comprises cyan, magenta and yellow color separations.

8. The method of controlling hue variation associated with a color IME according to claim 1, wherein the IME comprises cyan, magenta, yellow and black color separations.

9. The method of controlling hue variation associated with a color IME according to claim 1, further comprising:

performing the method of claim 1 for a plurality of IMEs.

10. An image rendering system comprising:

one or more color IMEs, and a controller, the controller configured to execute the method comprising:

printing a control patch for each color separation associated with the IME, the control patches associated with the actual rendering of respective target colors;

measuring the color separation error associated with the control patches relative to respective target colors;

determining which color separation has the maximum color separation error, and which color separation has the minimum color separation error;

determining the color separation error range ERR_range=ERR_Max−ERRMin, where ERR_Max equals the maximum color separation error and ERRMin equals the minimum color separation error; and reducing the density of the target color associated with the color separation associated with the maximum color separation error by a fraction of the ERR_range, and increasing the density of the target color associated with the color separation associated with the minimum color separation error by a fraction of the ERR_range, wherein the adjustment of the target colors associated with the maximum color separation error and minimum color separation error reduces the IME rendered hue variation associated with the IME color separations.

11. The image rendering system according to claim 10, wherein the controller is configured to execute the method comprising:

determining the color separation error range ERR_range=ERR_Max−ERRMin, where ERR_Max equals the maximum color separation error and ERRMin equals the minimum color separation error; and reducing the density of the target color associated with the color separation associated with the maximum color separation by ERR_range/2, and increasing the density of the target color associated with the color separation associated with the minimum color separation error by ERR_range/2.

12. The image rendering system according to claim 11, wherein the controller is configured to execute the method comprising:

comparing the color separation error range ERR_range with a predetermined threshold value ERR_threshold; and reducing and increasing the density of the target colors only if ERR_range is greater than ERR_threshold.

13. The image rendering system according to claim 12, wherein the controller is configured to execute the method comprising:

controlling hue variation associated with a color IME, wherein the target colors and control patches are midtone colors.

14. The image rendering system according to claim 10, wherein the controller is configured to execute the method comprising:

controlling hue variation associated with a color IME, wherein the target colors and control patches are midtone colors.

15. The image rendering system according to claim 10, wherein the controller is configured to execute the method comprising:

measuring the color separation error with an in-line densnometer operatively connected to the IME.

16. The image rendering system according to claim 10, wherein the controller is configured to execute the method comprising:

controlling hue variation associated with a color IME, wherein the IME comprises cyan, magenta and yellow color separations.

17. The image rendering system according to claim 10, wherein the controller is configured to execute the method comprising:

wherein the IME comprises cyan, magenta, yellow and black color separations.

18. A xerographic printing system comprising:

one or more color IMEs, and a controller, the controller configured to execute the method comprising:

printing a control patch for each color separation associated with the IME, the control patches associated with the actual rendering of respective target colors;

measuring the color separation error associated with the control patches relative to respective target colors;

determining which color separation has the maximum color separation error, and which color separation has the minimum color separation error;

determining the color separation error range ERR_range=ERR_Max−ERRMin, where ERR_Max equals the maximum color separation error and ERRMin equals the minimum color separation error; and reducing the density of the target color associated with the color separation associated with the maximum color separation error by a fraction of the ERR_range, and increasing the density of the target color associated with the color separation associated with the minimum color separation error by a fraction of the ERR_range, wherein the adjustment of the target colors associated with the maximum color separation error and minimum color separation error reduces the IME rendered hue variation associated with the IME color separations.

19. The xerographic printing system according to claim 18, comprising:

determining the color separation error range ERR_range=ERR_Max−ERRMin, where ERR_Max equals the maximum color separation error and ERRMin equals the minimum color separation error; and reducing the density of the target color associated with the color separation associated with the maximum color separation by ERR_range/2, and increasing the density of the target color associated with the color separation associated with the minimum color separation error by ERR_range/2.

20. The xerographic printing system according to claim 19, comprising:

comparing the color separation error range ERR_range with a predetermined threshold value ERR_threshold; and reducing and increasing the density of the target colors only if ERR_range is greater than ERR_threshold.

* * * * *